(12) United States Patent
Choi et al.

(10) Patent No.: US 9,831,264 B2
(45) Date of Patent: Nov. 28, 2017

(54) NONVOLATILE MEMORY DEVICE AND METHOD FOR FABRICATING THE SAME

(71) Applicant: SK hynix Inc., Gyeonggi-do (KR)

(72) Inventors: Eun-Seok Choi, Gyeonggi-do (KR); Sa-Yong Shim, Gyeonggi-do (KR); In-Hey Lee, Gyeonggi-do (KR); Sung-Wook Jung, Gyeonggi-do (KR); Jung-Seok Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/057,663

(22) Filed: Mar. 1, 2016

(65) Prior Publication Data

US 2016/0181275 A1    Jun. 23, 2016

Related U.S. Application Data

(62) Division of application No. 13/944,120, filed on Jul. 17, 2013, now Pat. No. 9,306,040.

(30) Foreign Application Priority Data

Apr. 9, 2013 (KR) .................. 10-2013-0038635

(51) Int. Cl.
| | | |
|---|---|---|
| *H01L 27/115* | (2017.01) | |
| *H01L 27/11582* | (2017.01) | |
| *H01L 27/11565* | (2017.01) | |
| *H01L 29/66* | (2006.01) | |
| *H01L 29/792* | (2006.01) | |
| *H01L 21/311* | (2006.01) | |

(Continued)

(52) U.S. Cl.
CPC ... *H01L 27/11582* (2013.01); *H01L 21/31111* (2013.01); *H01L 21/32134* (2013.01); *H01L 21/76802* (2013.01); *H01L 21/76877* (2013.01); *H01L 27/11565* (2013.01); *H01L 29/66833* (2013.01); *H01L 29/7926* (2013.01)

(58) Field of Classification Search
CPC ........... H01L 29/66833; H01L 29/7926; H01L 27/11582; H01L 21/76877; H01L 21/76802; H01L 21/32134; H01L 21/31111; H01L 27/11565
USPC ......... 438/269, 268, 156; 257/532, 211, 324
See application file for complete search history.

(56) References Cited

U.S. PATENT DOCUMENTS

| | | | | |
|---|---|---|---|---|
| 2011/0101443 A1* | 5/2011 | Huo | ................ | H01L 27/11551 257/324 |
| 2012/0139027 A1* | 6/2012 | Son | ................ | H01L 29/7926 257/324 |

(Continued)

*Primary Examiner* — Bo Fan
(74) *Attorney, Agent, or Firm* — IP & T Group LLP

(57) ABSTRACT

A nonvolatile memory device includes a substrate comprising a first word line formation area, a second word line formation area, and a support area interposed between the first and second word line formation areas; a first stacked structure disposed over the substrate of each of the first and second word line formation areas and having a plurality of interlayer dielectric layers and a plurality of conductive layers that are alternately stacked therein; a second stacked structure disposed over the substrate of the support area and having the plurality of interlayer dielectric layers and a plurality of spaces that are alternately stacked therein; a channel layer disposed in the first stacked structure; and a memory layer interposed between the channel layer and each of the plurality of conductive layers.

6 Claims, 9 Drawing Sheets

(51) Int. Cl.
*H01L 21/3213* (2006.01)
*H01L 21/768* (2006.01)

(56) References Cited

U.S. PATENT DOCUMENTS

| | | | | |
|---|---|---|---|---|
| 2012/0205722 A1* | 8/2012 | Lee | ................ | H01L 27/1157 257/211 |
| 2012/0235279 A1* | 9/2012 | Seo | ................ | H01L 27/10852 257/532 |
| 2012/0276696 A1* | 11/2012 | Yang | ................ | H01L 27/11556 438/156 |
| 2013/0059422 A1* | 3/2013 | Lee | ................ | H01L 21/764 438/268 |
| 2013/0249053 A1* | 9/2013 | Lee | ................ | H01L 28/40 257/532 |

\* cited by examiner

NONVOLATILE MEMORY DEVICE AND METHOD FOR FABRICATING THE SAME

CROSS-REFERENCE TO RELATED APPLICATIONS

This application is a division of U.S. patent application Ser. No. 13/944,120 filed on Jul. 17, 2013, which claims priority of Korean Patent Application No. 10-2013-0038635, filed on Apr. 9, 2013. The disclosure of each of the foregoing applications is incorporated herein by reference in its entirety.

BACKGROUND

1. Field

Exemplary embodiments of the present invention relate to a nonvolatile memory device, and more particularly, to a nonvolatile memory device including a plurality of memory cells stacked perpendicularly from a substrate and a method for fabricating the same.

2. Description of the Related Art

A nonvolatile memory device maintains data stored therein even when power supply is cut off and a variety of nonvolatile memory devices, for example, a NAND-type flash memory and the like are widely used.

Recently, as the improvement in integration degree of a two-dimensional (2D) memory device in which a plurality of memory cells are formed as a single layer over a silicon substrate approaches its limit, a variety of 3D memory volatile memory devices in which a plurality of memory cells are stacked perpendicularly from a silicon substrate have been proposed.

FIGS. 1A and 16 illustrate a conventional nonvolatile memory device. FIG. 1A is a plan view of the conventional nonvolatile memory device, and FIG. 16 is a cross-sectional view taken along line A-A' of FIG. 1A.

Referring to FIGS. 1A and 16, a plurality of semiconductor pillars 11 are disposed over a substrate 10 to extend in a direction perpendicular to the substrate 10. The plurality of semiconductor pillars 11 are arranged in a matrix shape along first and second directions. Furthermore, a stacked structure in which a plurality of insulation layers 12 and conductive layers 13 are alternately stacked is disposed over the substrate 10. The stacked structure is disposed to surround the semiconductor pillars 11. Between the stacked structure and the semiconductor pillar 11, a memory layer 14 may be interposed. The memory layer 14 serves to store data by storing or discharging electric charges. One semiconductor pillar 11, one conductive layer 13 contacted with the semiconductor pillar 11, and the memory layer 14 interposed therebetween may construct one memory cell MC. As a result, it may be seen that a plurality of memory cells MC are stacked in a perpendicular direction from the substrate 10.

The stacked structure of the insulation layers 12 and the conductive layers 13 be extended in the second direction while surrounding the semiconductor pillars 11 arranged in the second direction. The stacked structures surrounding the semiconductor pillars 11 adjacent in the first direction, respectively, are isolated from each other by a slit S positioned between the two semiconductor pillars 11. This is done to individually operate memory cells MC adjacent in the first direction, even though the semiconductor pillars 11 arranged in the first direction are connected to the same interconnection, for example, the same bit line.

However, when the slit S is positioned between the stacked structures, the stacked structures may lean as the height of the stacked structures is increased to improve the integration degree of the device.

In order to prevent the stacked structures from leaning the process of forming the stacked structures and the slit S may be performed for multiple times. In this case, however, the number of processes and the fabrication cost may be increased.

SUMMARY

Various exemplary embodiments of the present invention are directed to a nonvolatile memory device and a method for fabricating the same, which may increase the integration degree, prevent a defect occurring during a process, and reduce the process level difficulty.

In accordance with an exemplary embodiment of the present invention, a nonvolatile memory device may include a substrate comprising a first word line formation area, a second word line formation area, and a support area interposed between the first and second word line formation areas; a first stacked structure disposed over the substrate of each of the first and second word line formation areas and having a plurality of interlayer dielectric layers and a plurality of conductive layers that are alternately stacked therein; a second stacked structure disposed over the substrate of the support area and having the plurality of interlayer dielectric layers and a plurality of spaces that are alternately stacked therein; a channel layer disposed in the first stacked structure; and a memory layer interposed between the channel layer and each of the plurality of conductive layers.

In accordance with another exemplary embodiment of the present invention, a method for fabricating a nonvolatile memory device may include forming a stacked structure over a substrate the stacked structure including a plurality of interlayer dielectric layers and a plurality of sacrifice layers that are alternately stacked; etching the stacked structure to such a depth to pass through at least a lowermost sacrifice layer by using a mask pattern as an etch barrier, wherein the mask pattern covers a first word line formation area, a second word line formation area, and a support area interposed between the first and second word line formation areas; forming grooves by removing the plurality of sacrifice layers exposed by the etching; forming a conductive layer over the resulting structure having the grooves formed therein; and removing a part of the conductive layer so that the conductive layer of the grooves in the first and second word line formation areas remains while the conductive layer of the grooves in the support area is removed.

In accordance with still another exemplary embodiment of the present invention, a method for fabricating a nonvolatile memory device may include forming a stacked structure over a substrate, the stacked structure including a plurality of interlayer dielectric layers and a plurality of conductive layers that are alternately stacked; etching the stacked structure to such a depth to pass through at least a lowermost conductive layer by using a mask pattern as an etch barrier, wherein the mask pattern covers a first word line formation area, a second word line formation area, and a support area interposed between the first and second word line formation areas; and removing parts of the plurality of conductive layers so that the plurality of conductive layers in the first and second word line formation areas remain while the plurality of conductive layers in the support area are removed.

DETAILED DESCRIPTION

Figure 1A:
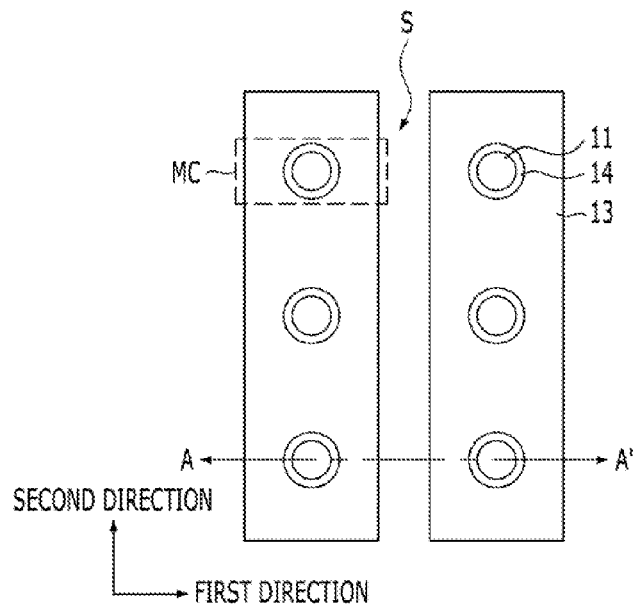
FIGS. 1A and 1B illustrate a conventional nonvolatile memory device.
Figure 1B:
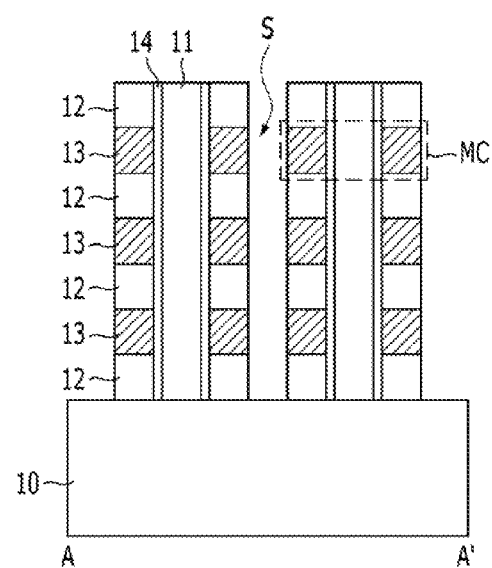

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 5:
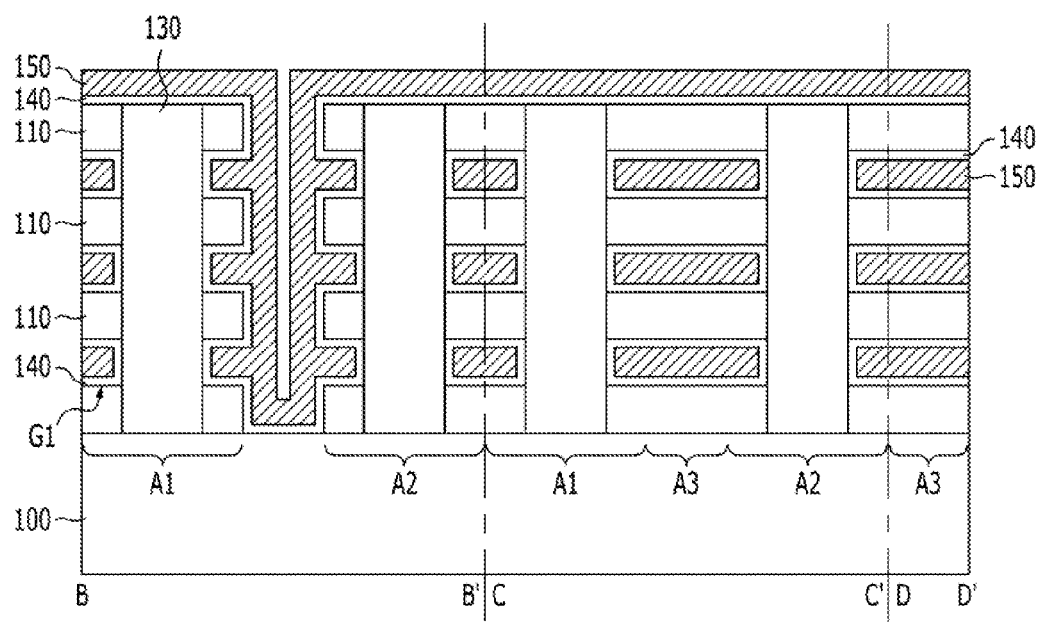
Figure 6:
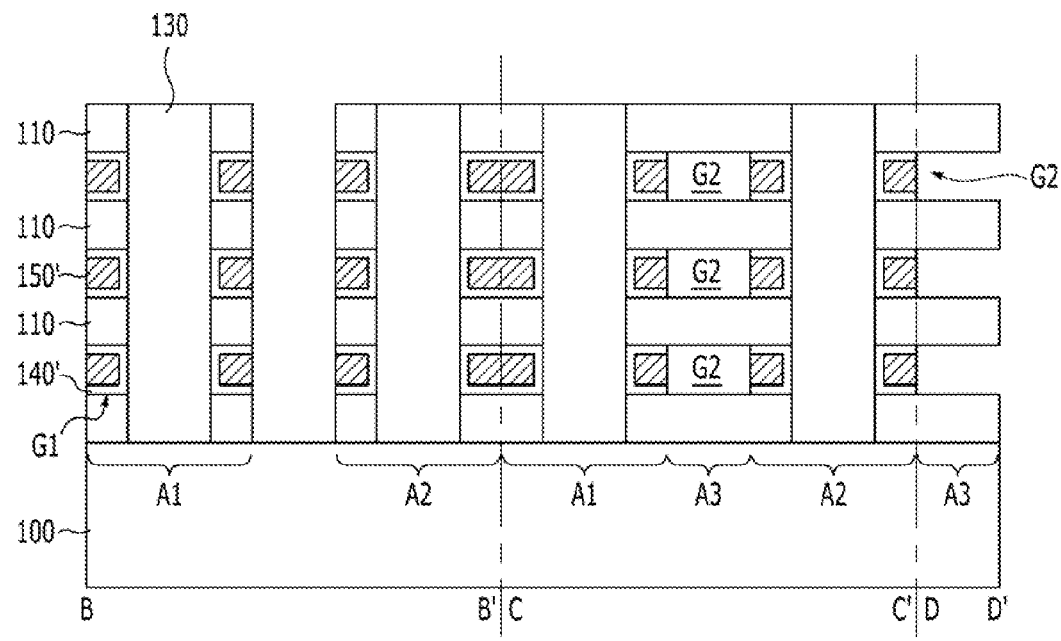
Figure 7:
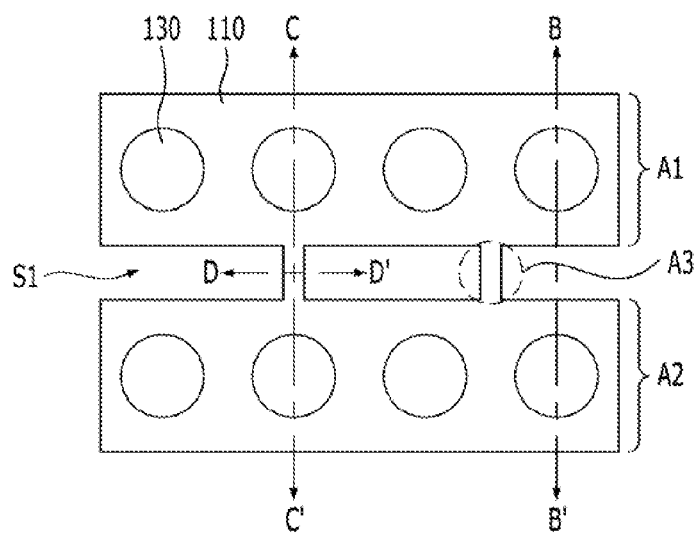

FIGS. 2 to 7 are diagrams for explaining a nonvolatile memory device and a method for fabricating the same in accordance with an embodiment of the present invention. FIG. 7 is a plan view, and FIGS. 2 to 6 are cross-sectional views taken along lines B-B', C-C', and D-D', of FIG. 7, respectively.

First, the fabrication method will be described with reference to the drawings.

Figure 2:
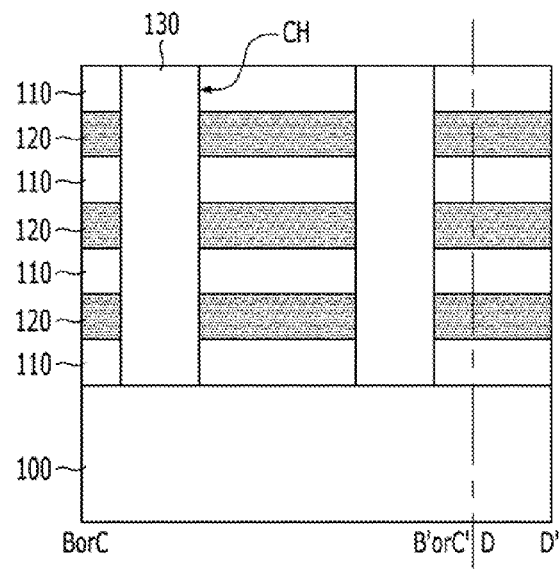
FIGS. 2 to 7 are diagrams illustrating a nonvolatile memory device and a method for fabricating the same in accordance with an embodiment of the present invention.

Referring to FIG. 2, a substrate 100 having a pre-formed structure (not illustrated), for example, a source area and the like is provided.

Then, a stacked structure in which a plurality of interlayer dielectric layers 110 and sacrifice layers 120 are alternately stacked is formed over the substrate 100. The sacrifice layer 120 serves to provide a space in which a word line to be described below is to be formed, and the interlayer dielectric layer 110 serves to isolate word lines positioned at different layers from each other. The interlayer dielectric layer 110 may be formed of, for example, oxide, and the sacrifice layer 120 may be formed of a material having an etching selectivity with respect to the interlayer dielectric layer 110, for example, nitride. In this embodiment of the present invention, three sacrifice layers 120 are formed. However, the present invention is not limited thereto, and the number of sacrifice layers 120 may change in various manners.

Subsequently, a channel layer 130 is formed to be connected to a part of the substrate 100 through the stacked structure of the interlayer dielectric layers 110 and the sacrifice layers 120. The channel layer 130 may be formed of a semiconductor material, for example, polysilicon. The channel layer 130 may be formed by the following process: the stacked structure of the interlayer dielectric layers 110 and the sacrifice layers 120 is selectively etched to form a channel hole CH that exposes the substrate 100, and a semiconductor material or the like is buried in the channel hole CH. Accordingly, the channel layer 130 has a pillar shape extending substantially perpendicular from the substrate 100. In this embodiment of the present invention, two channel layers 130 are arranged in the first direction parallel to line B-B' and four channel layers 130 are arranged in the second direction parallel to line D-D', as illustrated in FIG. 7. However, the present invention is not limited thereto, and the number and arrangement of channel layers 130 may change in various manners.

Figure 3:
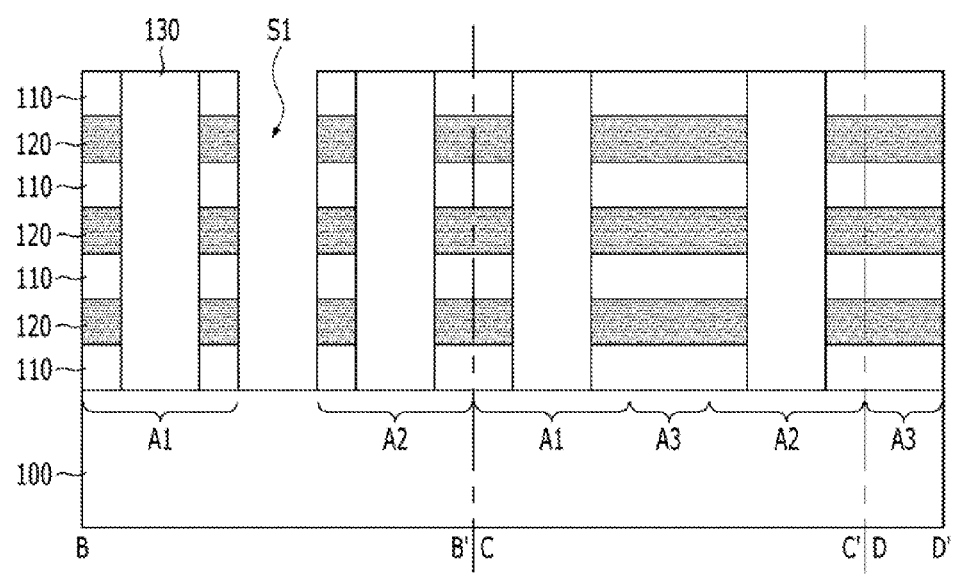

Referring to FIGS. 3 and 7, a mask pattern (not illustrated) is formed over the resultant structure of FIG. 2 to cover a portion between word line formation areas in the first direction while covering the word line formation areas. Then, the mask pattern is used as an etch barrier to etch the stacked structure of the interlayer dielectric layers 110 and the sacrifice layers 120. The word line formation area indicates a line-shaped area extending in the second direction while overlapping the channel layers 130 arranged in the second direction. The plan shape of the mask pattern is substantially the same as the plan shape of the interlayer dielectric layer 110 illustrated in FIG. 7.

As a result of this process, a slit S1 is formed to extend in the second direction while positioned between the channel layers 130 in the first direction. The slit S1 serves to isolate the stacked structures for each word line in the first direction. For convenience of description, an area in which a stacked structure at one side of the slit S1 is formed is referred to as a first word line formation area A1 and an area in which a stacked structure at the other side of the slit S1 is formed is referred to as a second word line formation area A2.

Furthermore, a stacked structure positioned between the stacked structures of the first and second word line formation areas A1 and A2 and connecting the stacked structures is formed at one or more positions of the slit S1. For the illustrative purpose, an area, in which the stacked structure positioned between the stacked structures of the first and second word line formation areas A1 and A2 is formed, is referred to as a support area A3. In this embodiment of the present invention, two support regions A3 are disposed in the slit S1, as illustrated in FIG. 7. However, the present invention is not limited thereto, and the number and positions of the support regions A3 in the slit S1 may be modified in various manners. The support area A3 may have a small width in the second direction. Particularly, the width of the support area A3 in the second direction may be smaller than the width of each of the first and second word line formation areas A1 and A2 in the first direction.

In this embodiment of the present invention, the slit S1 is formed to such a depth as to pass through the stacked structure. However the present invention is limited thereto and the depth of the slit S1 may be set to pass through the lowermost sacrifice layer 120.

Figure 4:
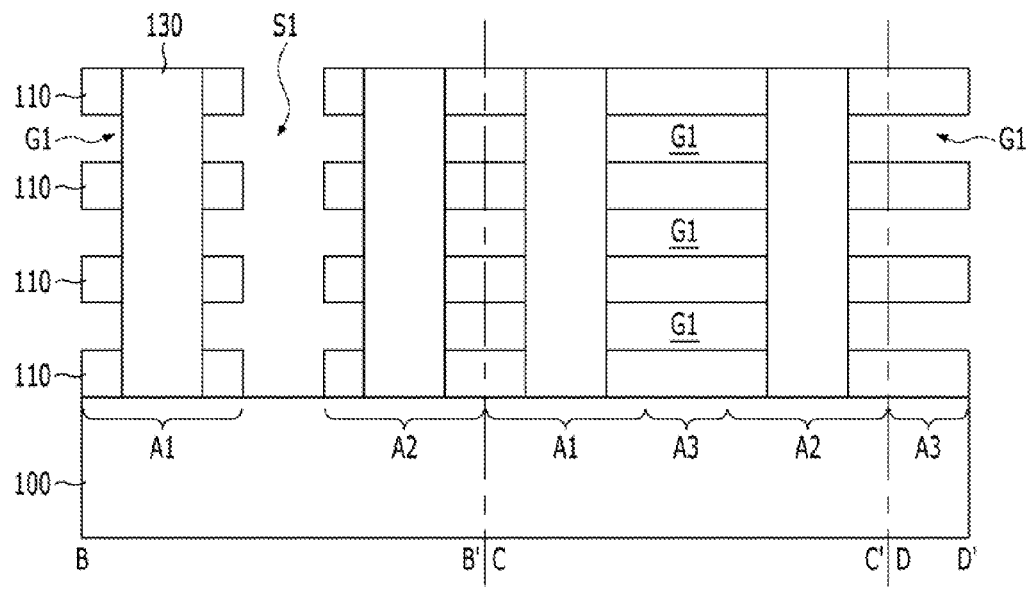

Referring to FIG. 4, the sacrifice layers 120 exposed through the S1 are removed. The removal of the sacrifice layers 120 may be performed through wet etching or the like. Hereafter, a space formed by removing the sacrifice layer 120 is referred to as a first groove G1.

Referring to FIG. 5, a memory layer 140 is formed along the entire surface of the resultant structure of FIG. 4 with a thickness that does not completely fill the first groove G1. The memory layer 140 serves to store data by storing or discharging electric charges. For example, the memory layer 140 may have a triple-layer structure, which may include a tunnel insulation layer for electric charge tunneling, a charge blocking layer for blocking charge transfer, and a charge storing layer interposed between the tunnel insulation layer and the charge blocking layer, for storing electric charges. In the triple-layer structure, the tunnel insulation layer is disposed in the closest place to the channel layer 130, and the charge blocking layer is disposed in the remotest place from the channel layer 130. The tunnel insulation layer and the charge block layer may be formed of, for example, oxide, and the charge storing layer may be formed of, for example, nitride having a charge trap function.

Then, a conductive layer 150 is formed along the entire surface of the memory layer 140 with such a thickness as to sufficiently fill the first groove G1 in which the memory layer 140 is formed. The conductive layer 150 for forming a word line may have a single-layer structure or a multilayer structure including a metal such as W or metal nitrides such as TiN and TaN. For example, the conductive layer 150 may have a double-layer structure of Ti and W, which are sequentially formed.

Referring to FIGS. 6 and 7, a conductive layer pattern 150' is formed by removing the conductive layer 150 within the slit. S1 and the support area A3 through wet etching or the like so that the conductive layer 150 exists, for example, only in the first grooves G1 at the first and second word line formation areas A1 and A2. At this time, the removal of the conductive layer 150 may be performed until the conductive layer 150 buried in the first groove G1 of the support area A3 is completely removed. As described above, the width of the stacked structure at the support area A3 in the second direction may be smaller than the width of each of the first and second word line formation area A1 and A2 in the first direction. Therefore, the conductive layers 150 of the first and second word line formation areas A1 and A2 may not be removed but left even at a time point when the conductive layer 150 of the support region A3 is completely removed. Hereafter, a space formed by removing the conductive layer 150 at the support area A3 is referred to as a second groove G2.

Subsequently, a memory layer pattern 140' is formed by removing the memory layer 140 within the slit S1 and the support area A3 through wet etching or the like so that the memory layer 140 exists, for example, only in the first grooves G1 at the first and second word line formation areas A1 and A2. However, this process may be omitted.

As a result of this process, a stacked structure, which extended in the second direction while surrounding the channel layers 130 arranged in the second direction and in which the interlayer dielectric layers 110 and the conductive layer patterns 150' are alternately stacked over the substrate 100, is formed at each of the first and second word line formation area A1 and A2. The conductive layer pattern 150' may serve as rd line. The memory layer pattern 140' is interposed between the conductive layer pattern 150' and the channel layer 130, and also interposed between the conductive layer pattern 150' and the interlayer dielectric layer 110, as illustrated in FIG. 6. On the other hand, a stacked structure in which the interlayer dielectric layers 110 and the second grooves G2 are alternately stacked over the substrate 100 is formed at the support area A3.

During this process, the removal process of the conductive layer 150 is performed until the conductive layer 150 buried in the first groove G1 of the support area A3 is completely removed. Therefore, the conductive layers 150 within the first grooves G1 at the first and second word line formation areas A1 and A2 may be lost more than necessary by over etching. In this case, a selective deposition process using the conductive layer pattern 150' as a seed layer may be additionally performed. When the selective deposition process is performed, the conductive layer pattern 50' serving as a seed layer remains in the first grooves G1 of the first and second word line formation areas A1 and A2. Therefore, a conductive material may be additionally grown on the conductive layer pattern 150' to compensate for the loss of the conductive layer 150 at the first and second word line formation areas A1 and A2. On the other hand, the conductive layer pattern 150' serving a seed layer does not exist in the second groove G2 of the support area A3. Therefore, conductive material is not grown within the second groove G2 of the support area A3.

Through the above-described process the nonvolatile memory device in accordance with the embodiment of the present invention may be fabricated.

Referring to FIGS. 6 and 7, the plurality of channel layers 130 are disposed over the substrate 100 to be extended in a substantially perpendicular direction from the substrate 100 and arranged along the first and second directions. For convenience of description, the channel layers 130 arranged in the second direction are referred to as a row of the channel layers 130.

Furthermore, a stacked structure in which the plurality of interlayer dielectric layers 110 and conductive layer patterns 150 are alternately stacked while surrounding the channel 130 is disposed over the substrate 100. Between the conductive layer pattern 150' and the channel layer 130, the memory layer pattern 140' is interposed.

As the conductive layer pattern 150' is extended in the second direction to surround the row of the channel layers 130, the conductive layer pattern 150' may serve as a word line, and is isolated for each row of the channel layers 130. In other words, the conductive layer pattern 150' of the first word line formation area A1 and the conductive layer pattern 150' of the second word line formation area A2 are isolated from each other.

On the other hand, the interlayer dielectric layer 110 not only may be positioned in the first and second word line formation areas A1 and A2 to isolate the conductive layer patterns 150' positioned thereon and thereunder from each other, but also may be positioned at the support area A3 corresponding to a portion between the first and second word line formation areas A1 and A2, thereby serving as a support for preventing the stacked structures of the first and second word line formation areas A1 and A2 from leaning.

That is, a stacked structure in which the interlayer dielectric layers 110 and the spaces represented as the second groove G2 are alternately stacked is disposed at the support area A1 Since no conductive material exists in the second groove G2 at the support area A3, a word line may be sufficiently isolated for each row of the channel layers 130. The number of interlayer dielectric layers 110 stacked at the support area A3 is equal to the number of interlayer dielectric layers 110 stacked at each of the first and second word line formation areas A1 and A2. Therefore, although the height of each of the stacked structures of the first and second word line formation areas A1 and A2 is increased to improve the integration degree of the semiconductor device, it may be possible to prevent the stacked structures from leaning.

The nonvolatile memory device and the method for fabricating the same in accordance with the embodiment of the present invention may have the following effect.

First, although the height of the stacked structure increased, the stacked structure may be prevented from leaning.

Furthermore, since the leaning may be prevented, the height of the stacked structure may be increased without restriction, which may further increase the integration degree of the device.

Furthermore, the nonvolatile memory device may be fabricated, for example, only by modifying the shape of a mask pattern during a mask process for etching a stacked structure. Therefore, the process may be simplified, and the number of processes and the fabrication cost may not be increased.

FIGS. 8 to 11 are diagrams illustrating a nonvolatile memory device, a method for fabricating the same in accordance with another embodiment of the present invention, and cross-sectional views taken along lines B-B', C-C', and D-D', respectively. The following descriptions will be focused on differences from the above-described embodiment.

Figure 8:
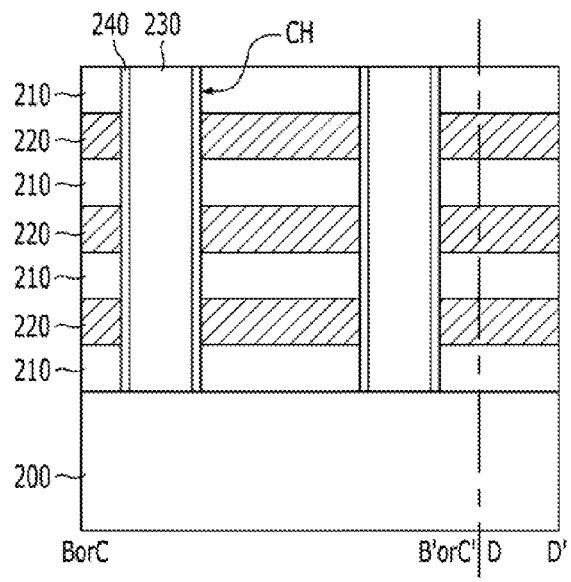
FIGS. 8 to 11 are diagrams illustrating a nonvolatile memory device and a method for fabricating the same in accordance with another embodiment of the present invention.

Referring to FIG. 8, a stacked structure in which a plurality of interlayer dielectric layers 210 and conductive layers 220 are alternately stacked is formed over a substrate 200. In this embodiment of the present invention, the conductive layer 220 to be used as a word line is directly deposited instead of the sacrifice layer 120.

Then a channel layer 230 is formed to be connected to a part of the substrate 200 through the stacked structure of the interlayer dielectric layers 210 and the conductive layers 220, and a memory layer 240 is formed to surround side surfaces of the channel layer 230. The formation of the channel layer 230 and the memory layer 240 may be performed by the following process: the stacked structure of the interlayer dielectric layers 210 and the conductive layers 220 is selectively etched to form a channel hole CH that exposes the substrate 200, the memory layer 240 is formed on sidewalls of the channel hole CH, and a semiconductor material is buried in the channel hole CH having the memory layer 240 formed therein.

Figure 9:
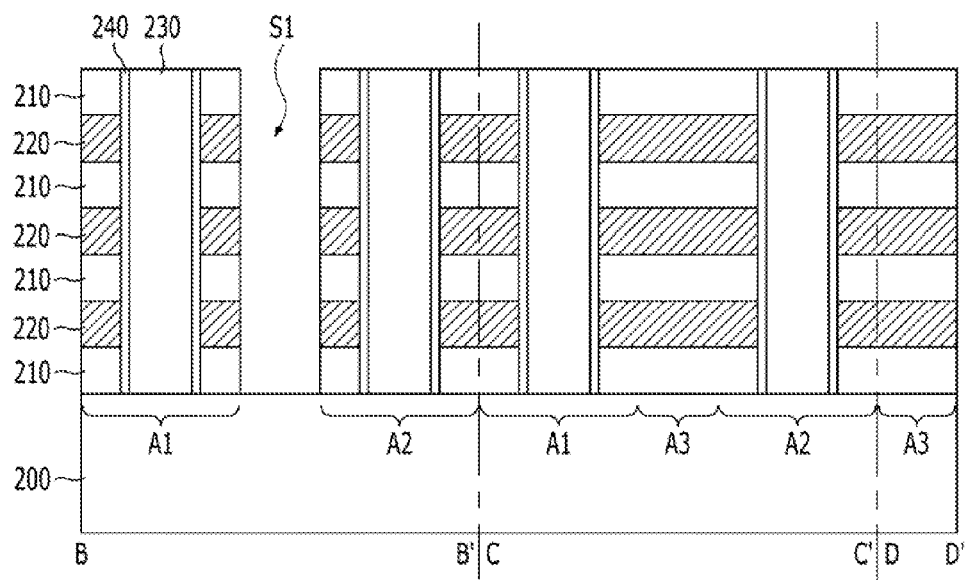

Referring to FIG. 9, a mask pattern (not illustrated) is formed over the resultant structure of FIG. 8 to cover first and second word line formation areas A1 and A2 and a support area A3 corresponding to a portion between the first and second word line formation areas A1 and A2. Then, the mask pattern is used as an etch barrier to etch the stacked structure, thereby forming a slit S1 to such a depth to pass through at least the lowermost conductive layer 220.

However, since the conductive layer 220 etched by this process is positioned in the support area A3 as well as the first and second word line formation areas A1 and A2, the conductive layers 220 of the first word line formation areas A1 and A2 are connected to each other. Therefore, a process of FIG. 10 is performed to isolate the conductive layers 220.

Figure 10:
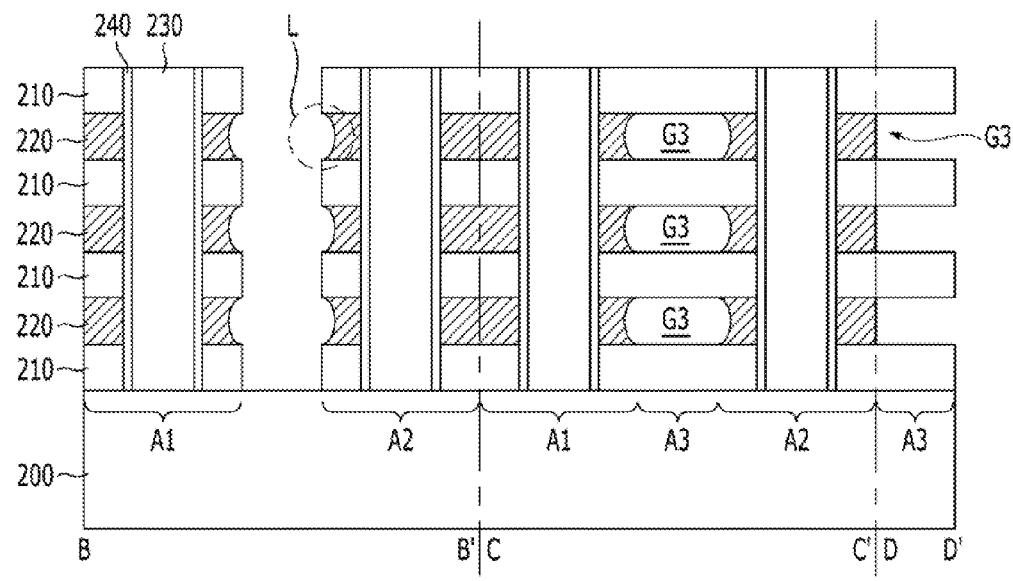

Referring to FIG. 10, a part of the conductive layer 220 is removed through wet etching or the like until the conductive layer 220 of the support area A3 is completely removed. As described above, the width of the support area A3 may be set to a small value. Therefore, the conductive layers 220 of the first and second word line formation areas A1 and A2 may be left even at a time when the conductive layer 220 of the support area A3 is completely removed. Accordingly, the conductive layer 220 of the first word line formation area A1 and the conductive layer 220 of the second word line formation area A2 may be isolated from each other, and may serve as first and second word lines. Hereafter, a space formed by removing the conductive layer 220 at the support area A3 is referred to as a third groove G3.

In this embodiment of the present invention, when the part of the conductive layer 220 is removed to form the third groove G3, the conductive layers 220 may also be lost at the first and second word line formation areas A1 and A2 (refer to symbol L). Therefore, the process of FIG. 11 may be performed to compensate for the loss.

Figure 11:
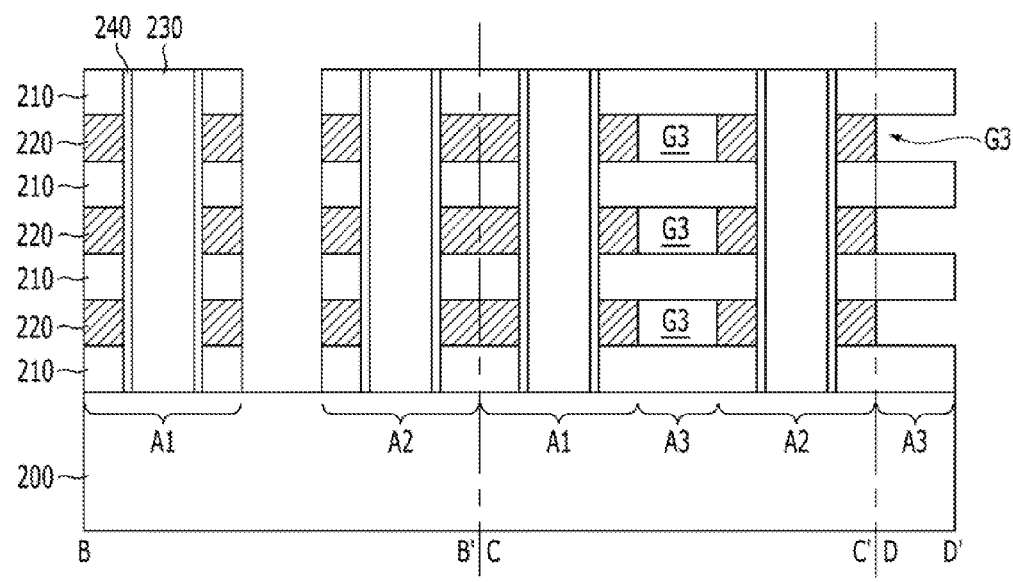

Referring to FIG. 11, a selective deposition process using the conductive layer 220 as a seed layer is performed. As a result, a conductive material is additionally grown on the conductive layers 220 of the first and second word line formation areas A1 and A2 to compensate for the loss (refer to L of FIG. 10). On the other hand, since the conductive layer 220 serving as a seed layer does not exist in the third groove G3 the third groove G3 may be maintained.

The device of FIG. 11, which is formed through the above-described process, is almost the same as the device of FIGS. 6 and 7. Accordingly, the device of FIG. 11 may have substantially the same effect as the device of FIGS. 6 and 7.

In the above-described embodiments, the simplified 3D nonvolatile memory device has been described. However, the present invention is not limited thereto, but may be applied to a variety of nonvolatile memory devices. Depending on the types of the nonvolatile memory devices, the position or depth of a slit may be modified. In a device having a slit, or particularly, a device having a slit formed with a large depth, a stacked structure in which a plurality of interlayer dielectric layers and a plurality of spaces are alternately stacked may be disposed at a support area of the slit, which may make it possible to acquire the same effect as the above-described embodiments. This will be described with reference to FIGS. 12 to 14.

Figure 12:
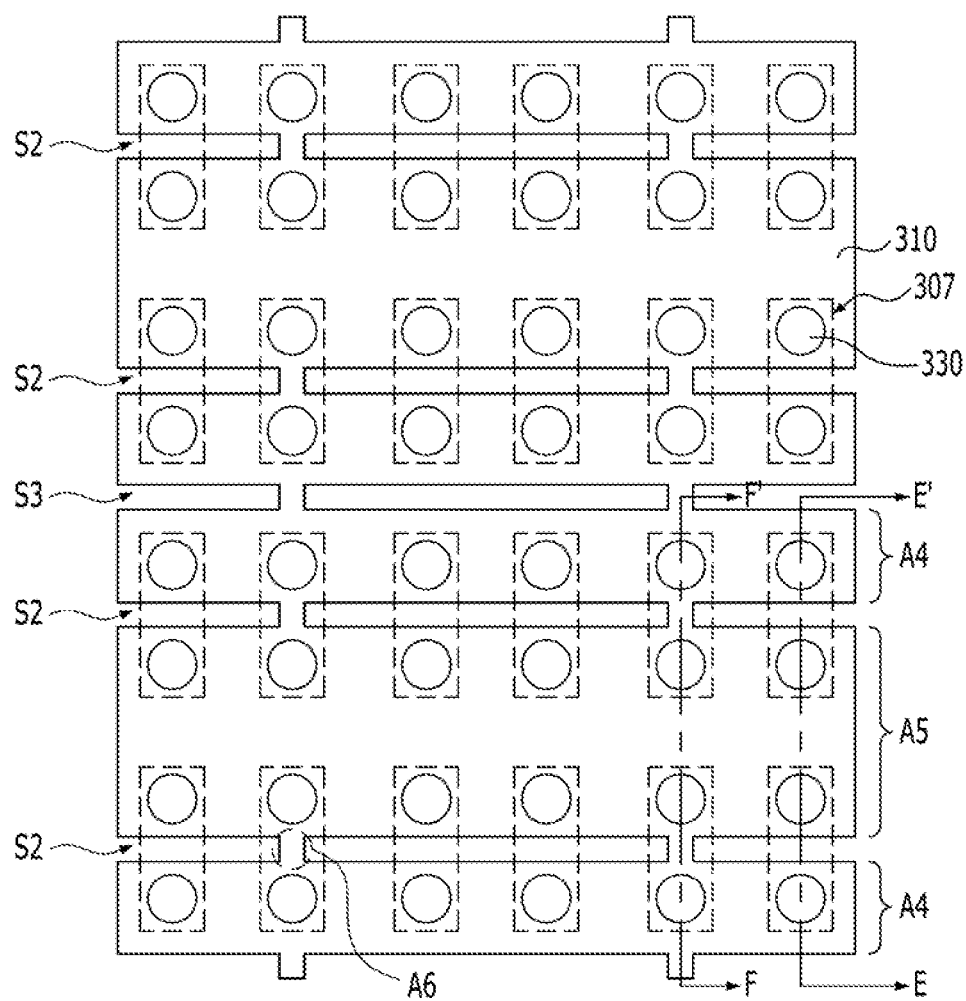
FIGS. 12 and 13 are diagrams illustrating a nonvolatile memory device in accordance with another embodiment of the present invention.
Figure 13:
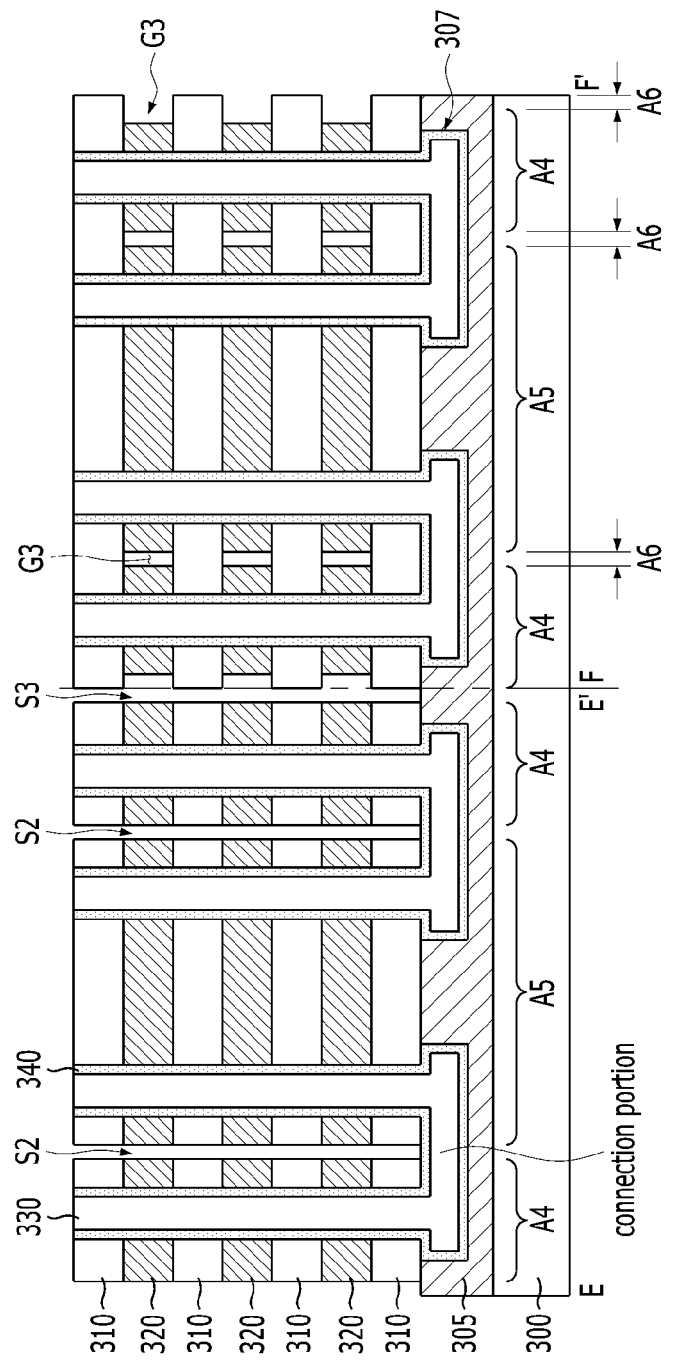

FIGS. 12 and 13 are diagrams for explaining a nonvolatile memory device in accordance with another embodiment of the present invention. FIG. 12 is a plan view, and FIG. 13 is a cross-sectional view taken along lines E-E' and F-F' of FIG. 12. The following descriptions will be focused on differences from the above-described embodiments.

Referring to FIGS. 12 and 13, a first conductive layer 305 for forming a back gate is disposed over a substrate 300. The first conductive layer 305 may have a plurality of trenches 307 formed therein. The plurality of trenches 307 may be arranged along a first direction parallel to line E-E' and a second direction crossing the first direction. Each of the trenches 307 may be formed in a bar shape of which the major axis is set in the first direction and the minor axis is set in the second direction.

A channel layer 330 is disposed over the first conductive layer 305. The channel layer 330 includes a connection portion buried in the trench 307 and a pair of vertical portions protruding perpendicularly from the connection portion. Accordingly, the channel layer 330 has a shape similar to a U-shape.

Furthermore, a stacked structure in which a plurality of interlayer dielectric layers 310 and second conductive layers 320 are alternately stacked while surrounding the vertical portions of the channel layer 330 that is disposed over the first conductive layer 305. Between the channel layer 330 and the stacked structure and between the channel layer 330 and the first conductive layer 305, a memory layer 340 may be interposed. The second conductive layer 320, the vertical portions of the channel layer 330, and the memory layer 340 therebetween may construct a memory cell. The first conductive layer 305, the connection portion of the channel layer 330, and the memory layer 340 therebetween may construct a back gate transistor. The back gate transistor serves to control the connection between the pair of the vertical portions of the channel layer 330.

Both ends of the U-shaped channel layer 330 may be connected to a bit line and a source line (not illustrated), which are disposed over the stacked structure, and may be controlled by the bit line and the source line. Particularly, in this embodiment of the present invention, one ends of two channel layers 330 adjacent in the first direction may be connected to one source line extended in the second direction, thereby constructing one memory block. On the other hand, the other ends of the two channel layers 330 adjacent in the first direction may be connected to one bit line extended in the first direction. Accordingly, the vertical portions of the channel layer 330 disposed in an area represented as A5 in the drawings are connected to the source line, and the vertical portions of the channel layer 330 disposed in an area represented as A4 in the drawings may be connected to the bit line.

The position of the slit within the stacked structure may be modified in various manners. In this embodiment of the present invention, as a first slit S2 extending in the second direction positioned between the pair of vertical portions of the channel layer 330, memory cells formed along the pair of vertical portions may be isolated from each other respectively. Furthermore, as the second slit S3 is positioned between the vertical portions of the channel layer 330 to be connected to a bit line, that is, the vertical portions of the area A4, memory cells may be isolated for each memory block. On the other hand, no slit may be disposed between the vertical portions of the channel layer 330 to be connected to one source line, that the vertical portions of the area A5.

The support area A6 is positioned in the first and second slits S2 and S3, and a stacked structure in which the interlayer dielectric layers 310 and the spaces represented as the third groove G3 are alternately stacked is disposed in the support area A6.

This embodiment of the present invention is not quite different from the above-described embodiments except that the memory cells are stacked along the U-shaped channel layer 330, and the positions of the slits S2 and S3 may be changed. Therefore, the detailed descriptions thereof are omitted herein.

Figure 14:
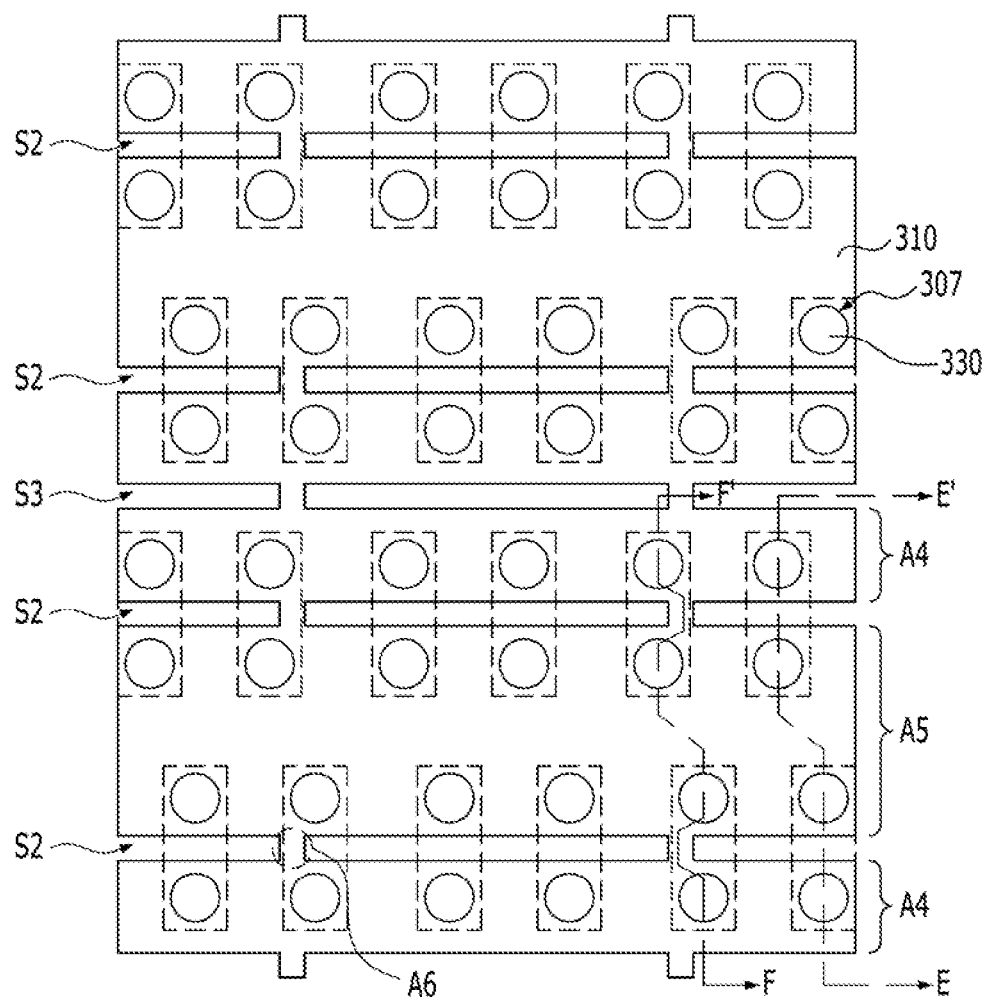
FIG. 14 is a diagram illustrating a nonvolatile memory device in accordance with another embodiment of the present invention.

FIG. 14 is a diagram for explaining a nonvolatile memory device in accordance with another embodiment of the present invention, and illustrates a modification for the embodiment of FIG. 13. The following descriptions will be focused on differences from the embodiment of FIG. 13.

Referring to FIG. 14, the positions of the channel layers 330 may not be positioned on a straight line, but may be arranged in a zigzag shape. This is done to facilitate a hole formation process for forming vertical portions by increasing the distance between the vertical portions of the channel layer 330. Although the positions of the channel layers 330 are modified, the shape or position of the slit may not need to be modified. Therefore, the structure of FIG. 14 may acquire the same effect as that of FIG. 13.

In accordance with the embodiments of the present invention, it may be possible to increase the integration degree, to prevent a defect occurring during the process, and to reduce the process level difficulty.

Although various embodiments have been described for illustrative purposes, it will be apparent to those skilled in the art that various changes and modifications may be made without departing from the spirit and scope of the invention as defined in the following claims.

What is claimed is:

1. A method for fabricating a nonvolatile memory device, comprising:
    forming a stacked structure over a substrate, the stacked structure including a plurality of interlayer dielectric layers and a plurality of sacrifice layers that are alternately stacked;
    etching the stacked structure to such a depth to pass through at least a lowermost sacrifice layer by using a mask pattern as an etch barrier, wherein the mask pattern covers a first word line formation area, a second word line formation area, and a support area interposed between the first and second word line formation areas;
    forming grooves by removing the plurality of sacrifice layers exposed by the etching;
    foliating a conductive layer over the resulting structure having the grooves formed therein; and
    removing a part of the conductive layer so that the conductive layer of the grooves in the first and second word line formation areas remains while the conductive layer of the grooves in the support area is removed,
    wherein the plurality of interlayer dielectric layers are further positioned at the support area corresponding to a portion between the first and second word line formation areas and serve a support for preventing the stacked structure of the first and second word line formation areas from leaning.

2. The method of claim 1, wherein the first and second word line formation areas are extended in a second direction,
    the support area is positioned between the first and second word line formation areas in a first direction crossing the second direction, and
    the width of each of the first and second word line formation areas in the first direction is larger than the width of the support area in the second direction.

3. The method of claim 1, further comprising forming a channel layer connected to a part of the substrate through the stacked structure in the first and second word line formation areas.

4. The method of claim 1, further comprising forming a memory layer over the resultant structure having the grooves formed therein, before the forming of the conductive layer.

5. The method of claim 1, wherein the removing of the part of the conductive layer is performed by wet etching.

6. The method of claim 1, further comprising performing a selective deposition process using the conductive layer as a seed layer, after the removing of the part of the conductive layer.

* * * * *